(12) United States Patent
Huang et al.

(10) Patent No.: US 9,117,782 B2
(45) Date of Patent: Aug. 25, 2015

(54) OLED DISPLAY

(71) Applicant: InnoLux Corporation, Miao-Li County (TW)

(72) Inventors: Hao-Jung Huang, Miao-Li County (TW); Chia-Pin Kang, Miao-Li County (TW); Che-Wei Lin, Miao-Li County (TW); Hao-Yu Chou, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/132,247

(22) Filed: Dec. 18, 2013

(65) Prior Publication Data

US 2014/0246654 A1 Sep. 4, 2014

(30) Foreign Application Priority Data

Mar. 4, 2013 (TW) .............................. 102107438 A

(51) Int. Cl.
| | |
|---|---|
| H01L 29/08 | (2006.01) |
| H01L 29/04 | (2006.01) |
| H01L 29/18 | (2006.01) |
| H01L 33/00 | (2010.01) |
| H01L 27/32 | (2006.01) |
| H01L 51/50 | (2006.01) |
| H01L 51/05 | (2006.01) |
| H01L 51/00 | (2006.01) |

(52) U.S. Cl.
CPC ............ *H01L 27/326* (2013.01); *H01L 51/0068* (2013.01); *H01L 51/0545* (2013.01); *H01L 51/50* (2013.01)

(58) Field of Classification Search
CPC ... H01L 27/326; H01L 51/50; H01L 51/0545; H01L 51/0068
USPC .................... 257/40, 88, 59, 98–99, E23.068; 438/28, 34, 35, 46
See application file for complete search history.

(56) References Cited

U.S. PATENT DOCUMENTS

| | | | | |
|---|---|---|---|---|
| 2004/0201558 | A1* | 10/2004 | Arnold et al. | 345/83 |
| 2006/0028495 | A1* | 2/2006 | Phan | 345/694 |
| 2009/0121983 | A1* | 5/2009 | Sung et al. | 345/76 |
| 2011/0133227 | A1* | 6/2011 | Lee et al. | 257/89 |
| 2011/0279493 | A1* | 11/2011 | Phan | 345/694 |

* cited by examiner

*Primary Examiner* — Long K Tran
*Assistant Examiner* — Dzung Tran
(74) *Attorney, Agent, or Firm* — McClure, Qualey & Rodack, LLP

(57) ABSTRACT

An OLED display is disclosed, which includes a substrate and a first and a second light emitting unit arranged on the substrate. A first, a second, a third and a fourth region are defined on the substrate, wherein the sub-pixels in the first and fourth regions and the sub-pixels in the second and third regions are symmetrical with each other. Alternatively, the sub-pixels in the first region and the sub-pixels in the third region are point symmetric to a center of the first light emitting unit, so as to improve displaying resolution of the OLED display.

21 Claims, 6 Drawing Sheets

OLED DISPLAY

CROSS REFERENCE TO RELATED APPLICATIONS

This Application claims priority of Taiwan Patent Application No. 102107438, filed on Mar. 4, 2013, the entirety of which is incorporated by reference herein.

BACKGROUND

1. Field of the Invention

The disclosure relates to a color organic light emitting diode (OLED) display, and in particular relates to an OLED display having better display resolution by adjusting an arrangement of pixel units thereof.

2. Description of the Related Art

An organic light emitting diode (OLED) generally includes a cathode, and an anode and organic materials disposed between the cathode and the anode. The illuminance of the OLED is determined by the electric current flowing from the anode to the cathode. Therefore, in order to improve the illuminance of an OLED, a large driving voltage should be applied thereto so as to increase the electric current passing therethrough and enable the formation of an exciton, i.e. a recombination of the "electron-hole".

The manufacturing of an OLED display involves the use of a metal mask when evaporating organic materials. However, as the precision of the metal mask cannot be improved, the current technology can only produce products with display resolution of 200-250 pixels per inch (PPI). Therefore, the competitiveness of OLED products is hindered due to limitation in display resolution.

SUMMARY

In light of the foregoing, one of the disclosed embodiments provides an OLED display in which a conventional metal mask is used to evaporate organic materials on a substrate which is arranged with pixel electrodes to define sub-pixels with special patterns so as to improve display resolution.

According to one embodiment, the OLED display includes a substrate, a plurality of pixel units, a plurality of first light-emitting units and a plurality of second light-emitting units. Each of the plurality of first light-emitting units has a first sub-pixel, a second sub-pixel, and a third sub-pixel. The plurality of first light-emitting units are arranged on the substrate in a matrix, and the first and plurality second light-emitting units are arranged alternatively in a direction parallel to a transverse axis.

The transverse axis and a longitudinal axis intersecting to the transverse axis divide each of the plurality of first light-emitting units into four regions and each of the plurality of first light-emitting units includes a first light-emissive layer, two second light-emissive layers and two third light-emissive layers. Each of the first, second and third light-emissive layers, respectively, corresponds to the plurality of first, second and third sub-pixels. Additionally, the first light-emissive layer overlaps with the longitudinal axis, and the configuration of the first, second, and third sub-pixels in each of the two pixel units that are adjacent are symmetrical with each other with respect to the transverse axis.

In some embodiments, in each of the plurality of first light-emitting units one of the two second light-emissive layers is disposed in the first region, and the other second light-emissive layer is disposed in the second region; that is, the sub-pixels in the first and fourth regions and the sub-pixels in the second and third regions are symmetrical with each other with respect to the longitudinal axis. In some other embodiments, in each of the plurality of first light-emitting units one of the two second light-emissive layers is disposed in the first region, and the other second light-emissive layer is disposed in the third region; that is, the sub-pixels in the first region and the sub-pixels in the third region are point symmetric to a center of each of the plurality of first light-emitting units.

In the above-mentioned embodiment, lights emitted from the first, second and third light-emissive layers have different wavelengths. Specifically, the maximum value among the light emitting wavelength of the first light-emissive layers range from about 380 nm to about 495 nm, the maximum value among the light emitting wavelength of the second light-emissive layers range from about 580 nm to about 700 nm, the maximum value among the light emitting wavelength of the third light-emissive layers range from about 495 nm to about 590 nm.

In some embodiments, each of the plurality of first light-emitting units includes a plurality of pixels units, and each of the plurality of pixel units includes a first sub-pixel, a second sub-pixel and a third sub-pixel. A length of the first sub-pixels in the direction parallel to the longitudinal axis is larger than a length of the second sub-pixels or a length of the third sub-pixels in the direction parallel to the longitudinal axis. Therefore, in a single pixel unit, an area of the first sub-pixel is larger than an area of the second sub-pixel, and the area of the first sub-pixel is larger than an area of the third sub-pixel. In some other embodiments, each pixel unit includes two first sub-pixels, one second sub-pixel and one sub-pixel.

In the above-mentioned embodiments, each of the two second light-emissive layers corresponds to four second pixels, and each of the two third light-emissive layers corresponds to four third pixels.

In the above-mentioned embodiments, the pattern of the sub-pixels are affected by the openings of the metal mask via a vaporizing process, in which a distance between one of the second light-emissive layers and one of the third light-emissive layers in the direction parallel to the longitudinal axis is larger than a distance between the second sub-pixels in one of the second light-emissive layers and is larger than a distance between the third sub-pixels in one of the third light-emissive layers. Additionally, a distance between one of the second light-emissive layers and one of the closest first light-emissive layers in the direction parallel to the transverse axis or a distance between one of the third light-emissive layers and one of the closest first light-emissive layers in the direction parallel to the transverse axis is larger than a distance between the second sub-pixels in one of the second light-emissive layers and is larger than a distance between the third sub-pixels in one of the third light-emissive layers and is larger than a distance between the first sub-pixels in one of the first light-emissive layers. Moreover, a distance between one of the second light-emissive layers and one of the closest first light-emissive layers in the direction parallel to the transverse axis or a distance between the third light-emissive layer and one of the closest first light-emissive layers in the direction parallel to the transverse axis is larger than a distance between the first sub-pixels in one of the first light-emissive layer.

In some embodiments, in a direction parallel to the longitudinal axis, the first sub-pixels are spaced by the same distance. In some the other embodiments, in a direction parallel to the longitudinal axis, the first sub-pixels are spaced by a first distance and a second distance different from the first distance, periodically.

In the above-mentioned embodiments, the first, second and third sub-pixels are OLEDs, wherein the first, second and third sub-pixels are top-emitting OLEDs or bottom-emitting OLEDs.

According to another embodiment of the present disclosure, an OLED display includes a substrate and a plurality of pixel units. Each pixel unit includes a first sub-pixel, a second sub-pixel and a third sub-pixel, wherein the configurations of the first, second and third sub-pixels in two neighboring pixel units are symmetrical with each other.

In the above-mentioned embodiments, the OLED display further includes a first light-emissive layer corresponding to a plurality of first sub-pixels, a second light-emissive layer corresponding to four second sub-pixels and a third light-emissive layer corresponding to four third sub-pixels. The four second sub-pixels are formed by a single evaporation process, and the second light-emissive layer among the four second sub-pixels is successively extended. The four third sub-pixels are formed by a single evaporation process, and the third light-emissive layer among the four third sub-pixels is successively extended.

BRIEF DESCRIPTION OF THE DRAWINGS

The present invention is more fully understood by reading the subsequent detailed description and examples with references made to the accompanying drawings, wherein.

DETAILED DESCRIPTION

Several exemplary embodiments of the application are described with reference to FIGS. 1 through 6. It is to be understood that the following disclosure provides various different embodiments as examples for implementing different features of the application. This description is made for the purpose of illustrating the general principles of the invention and should not be taken in a limiting sense.

Figure 1:
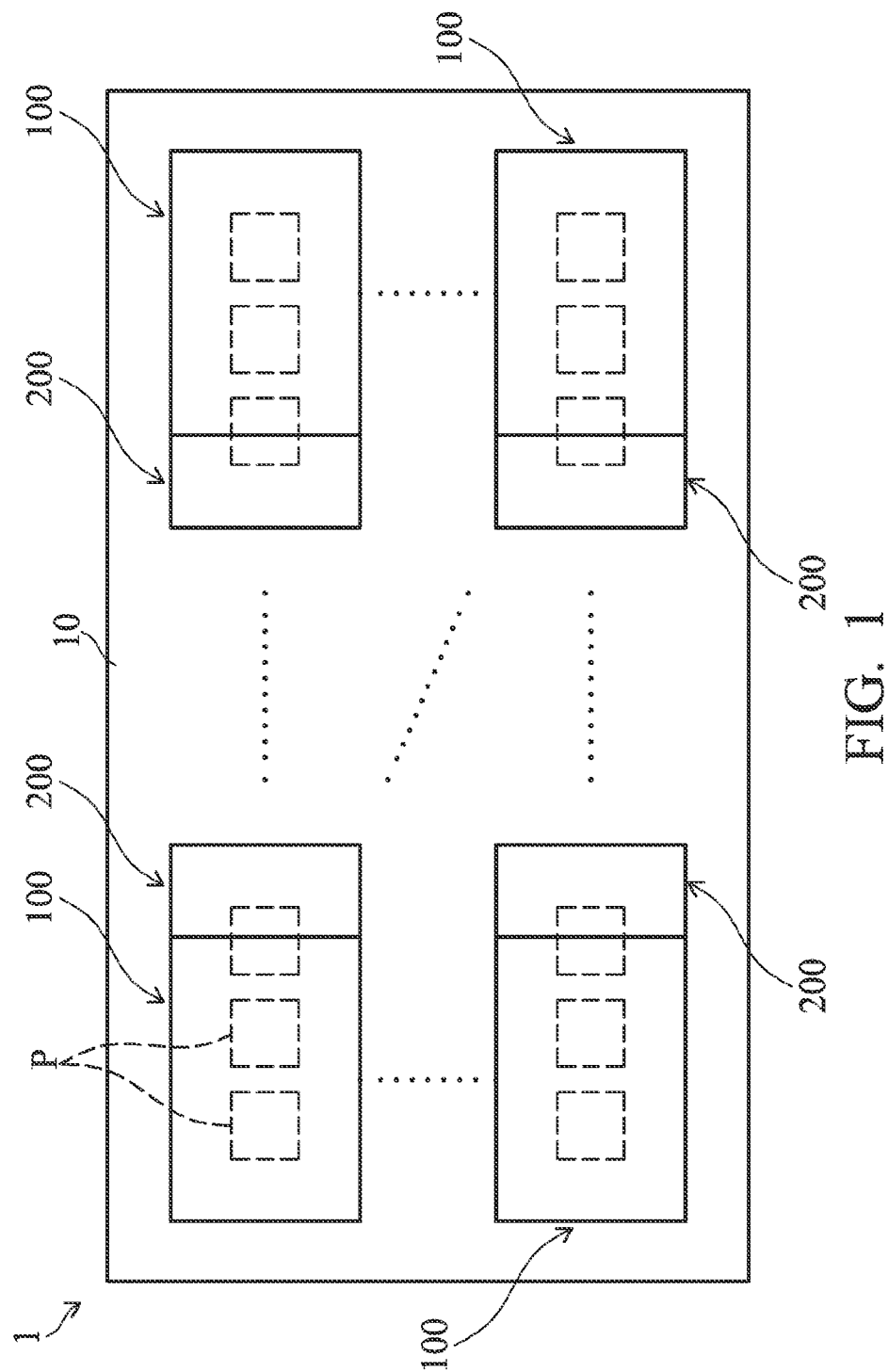
FIG. 1 shows a top view of an OLED display of an embodiment of the present disclosure.

Referring to FIG. 1, in accordance with one embodiment of the present disclosure, the OLED display 1 includes a substrate 10, a plurality of first light-emitting units 100 and a plurality of second light-emitting units 200. Before the plurality of first light-emitting units 100 and plurality second light-emitting units 200 are disposed on the substrate 10, a plurality of pixel electrodes (not shown in figure) are disposed on the substrate 10 in advance, wherein the pixel electrodes are controlled by suitable means so as to implement the operation of the pixels of the OLED display 1.

In the embodiment, the plurality of first light-emitting units 100 and plurality second light-emitting units 200 arranged in a matrix are formed on the electrode pixels of the substrate 10 by vaporizing, wherein the plurality of first light-emitting units 100 and plurality second light-emitting units 200 are arranged alternatively in a traversal direction to successively define a plurality of pixel unit P on the substrate 10.

Figure 2:
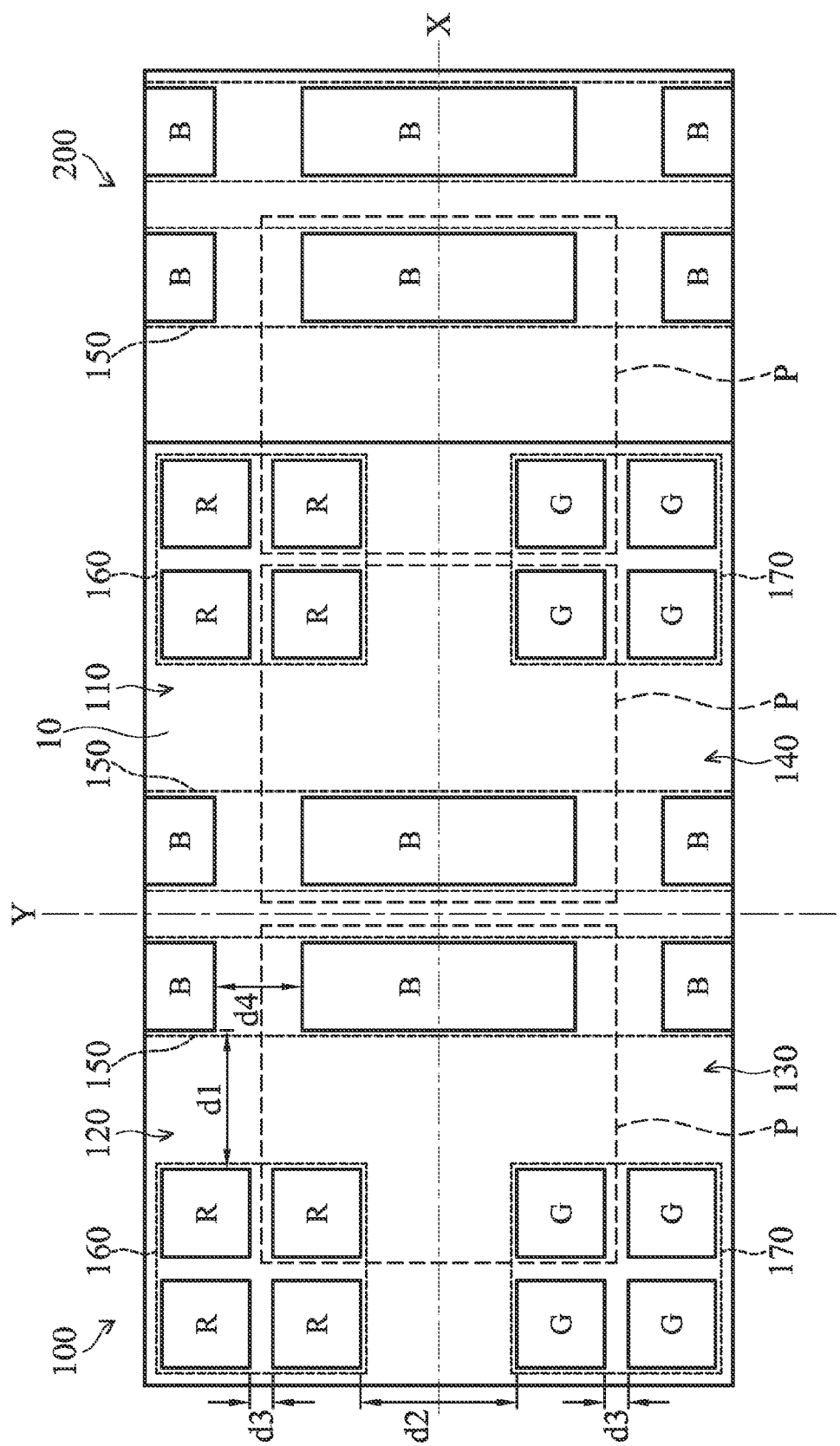
FIG. 2 shows a schematic view of a first and a second lighting element of the OLED display of the embodiment of the present disclosure.

Specifically, referring to FIG. 2, a transverse axis X and a longitudinal axis Y orthogonal to the transverse axis X divide each of the plurality of first light-emitting units 100 into a first region 110, a second region 120, a third region 130 and a fourth region 140, wherein the first and third regions 110, 130 are located at opposite corners of each of the plurality of first light-emitting units 100, and the second and fourth regions 120, 140 are diagonally located at the other opposite corners of the plurality of first light-emitting units 100.

The plurality of first light-emitting units 100 each include a first light-emissive layer 150, two second light-emissive layers 160 and two third light-emissive layers 170, and the second light-emitting units 200 each include a first light-emissive layer 150. The first light-emissive layer 150 of the plurality of first light-emitting units 100 overlaps with the longitudinal axis Y. The two second light-emissive layers 160 are disposed in the first and second regions 110, 120 and spaced apart from the first light-emissive layer 150 by a distance d1. The two third light-emissive layers 170 are disposed in the third and fourth regions 130, 140 and spaced apart from the first light-emissive layer 150 at a distance d1. Additionally, each second light-emissive layer 160 and each of third light-emissive layer 170 are spaced apart from each other at a distance d2 in a direction parallel to the longitudinal axis Y. The first light-emissive layer 150 of each of the plurality of second light-emitting units 200 has the same arrangement as that of the first light-emissive layer 150 of each of the plurality of first light-emitting units 100 and are adjacent to one of the plurality of first light-emitting units 100 in a direction parallel to the transverse axis X.

As shown in FIG. 2, the first, second and third light-emissive layers 150, 160 and 170 of each of the plurality of first light-emitting units 100 and the first light-emissive layer 150 of each of the plurality of second light-emitting units 200, respectively, correspond to a plurality of first, second and third sub-pixels B, R and G, wherein each of the first light-emissive layer 150 corresponds to a plurality of first sub-pixels B which are spaced apart at a distance d4, and each second light-emissive layer 160 corresponds to four second sub-pixels R which are spaced apart at a distance d3, and each of third light-emissive layer 170 corresponds to four third sub-pixels G which are spaced apart at a distance d3. In the embodiment, the light emitted from the first light-emissive layers 150 in an excited state is blue light, the light emitted from the second light-emissive layers 160 in an excited state is red light, and the light emitted from the third light-emissive layers 170 in an excited state is green light.

One skilled in the art will appreciate that while the first, second and third light-emissive layers 150, 160 and 170 are successively extended on the regions of the substrate 10, lights with specific wavelengths can only be able to be emitted from the first, second and third sub-pixels B, R and G when the first, second and third sub-pixels B, R and G, which corresponds to the pixel electrodes (not shown in figure) of the substrate 10, are excited by electric current. Thus, in FIG. 1, the first, second and third light-emissive layers 150, 160 and 170 are shown in dashed line, and the first, second and third sub-pixels B, R and G which are capable of emitting light is shown in solid line.

In this regard, in each of the plurality of first light-emitting units 100 the sub-pixels in the first and fourth regions 110, 140 and the sub-pixels in the second and third regions 120, 130 are symmetrical with each other with respect to the longitudinal axis Y, thereby defining two pixel units P in each side of the longitudinal axis Y, wherein each pixel unit P includes one first sub-pixel B, one second sub-pixel R and one third sub-pixel G. Additionally, referring to FIGS. 1 and 2, a plurality of pixel units are defined in between each of the plurality of first light-emitting units 100 and the neighboring first light-emitting unit 100 in a longitudinal axis Y and in between each of the plurality of first light-emitting units 100 and the neighboring second light-emitting unit 200 in a transverse axis X. Moreover, the arrangement of the first, second and third sub-pixels B, R and G in two neighboring pixel units P are symmetrical with each other in the direction parallel to the longitudinal axis Y.

Due to drawbacks where the blue light-emissive layers tend to malfunction when operating with high electric currents, a method is provided in the embodiment. As shown in FIG. 2, a length of the first sub-pixels B in the direction parallel to the longitudinal axis Y is larger than a length of the second sub-pixels G or a length of the third sub-pixels R in the direction parallel to the longitudinal axis Y. In a single pixel unit P an area of the first sub-pixel B is larger than an area of the second sub-pixel G, and the area of the first sub-pixel is larger than an area of the third sub-pixel R. Thus, a smaller electric current is applied to the first sub-pixels B than that applied to the second and third sub-pixels R and G, and the first, second and third sub-pixels B, R and G may emit lights with same illuminance.

The manufacturing method of the OLED display 1 is described in detail. Firstly, driving circuits and pixel electrodes (not shown in figures) are formed on the substrate 10, and metal masks 300, 400 and 500 shown in FIGS. 3A(1)-3C are configured to evaporate organic materials on the substrate 10. Specifically, the metal mask 300 includes an opening 310 with a rectangular shape, wherein the size and position of the opening 310 are determined according to the size and positions of the first light-emissive layers 150. The metal mask 400 includes two rectangular shaped openings 410 and, the sizes and positions of the openings 410 are determined according to the size and positions of the second light-emissive layers 160. The metal mask 500 includes two rectangular shapes openings 510, and the sizes and positions of the openings 510 are determined according to the size and positions of the third light-emissive layers 170.

In order to allow for tolerance during alignment, the distances between the first, second and third light-emissive layers 150, 160 and 170 are larger than the distance between the sub-pixels in corresponding light-emissive layers. Specifically, the distance d2 between one of the second light-emissive layers 160 and one of the third light-emissive layers 170 in a direction parallel to the longitudinal axis Y is larger than the distance d3 between the second sub-pixels R in each of the second light-emissive layer 160 and is larger than the distance d3 between the third sub-pixels G in each of the third light-emissive layer 170. Additionally, the distance d1 between each of the second light-emissive layer 160 and one of the closest first light-emissive layers 150 in the direction parallel to the transverse axis X or the distance d1 between each of the third light-emissive layers 170 and one of the closest first light-emissive layers 150 in the direction parallel to the transverse axis X is larger than the distance d3 between the second sub-pixels R in each of the second light-emissive layer 160 and is larger than the distance d3 between the third sub-pixels G in each of the third light-emissive layer 170 and is larger than a distance d4 between the first sub-pixels B in each of the first light-emissive layer 150.

Note that, the metal masks 300, 400 and 500 each have a resolution of 200 pixels per inch (PPI), which are commercially available. In one exemplary embodiment, the distance d1 ranges about 24.3±12 mm, the distance d2 ranges about 23.0±12 mm, the distance d3 ranges about 8±12 mm, and the distance d4 ranges about 14±12 mm. A width of each pixel unit P ranges about 55±12 mm, such that a display resolution of the OLED display 1 is 460 PPI.

Figure 4:
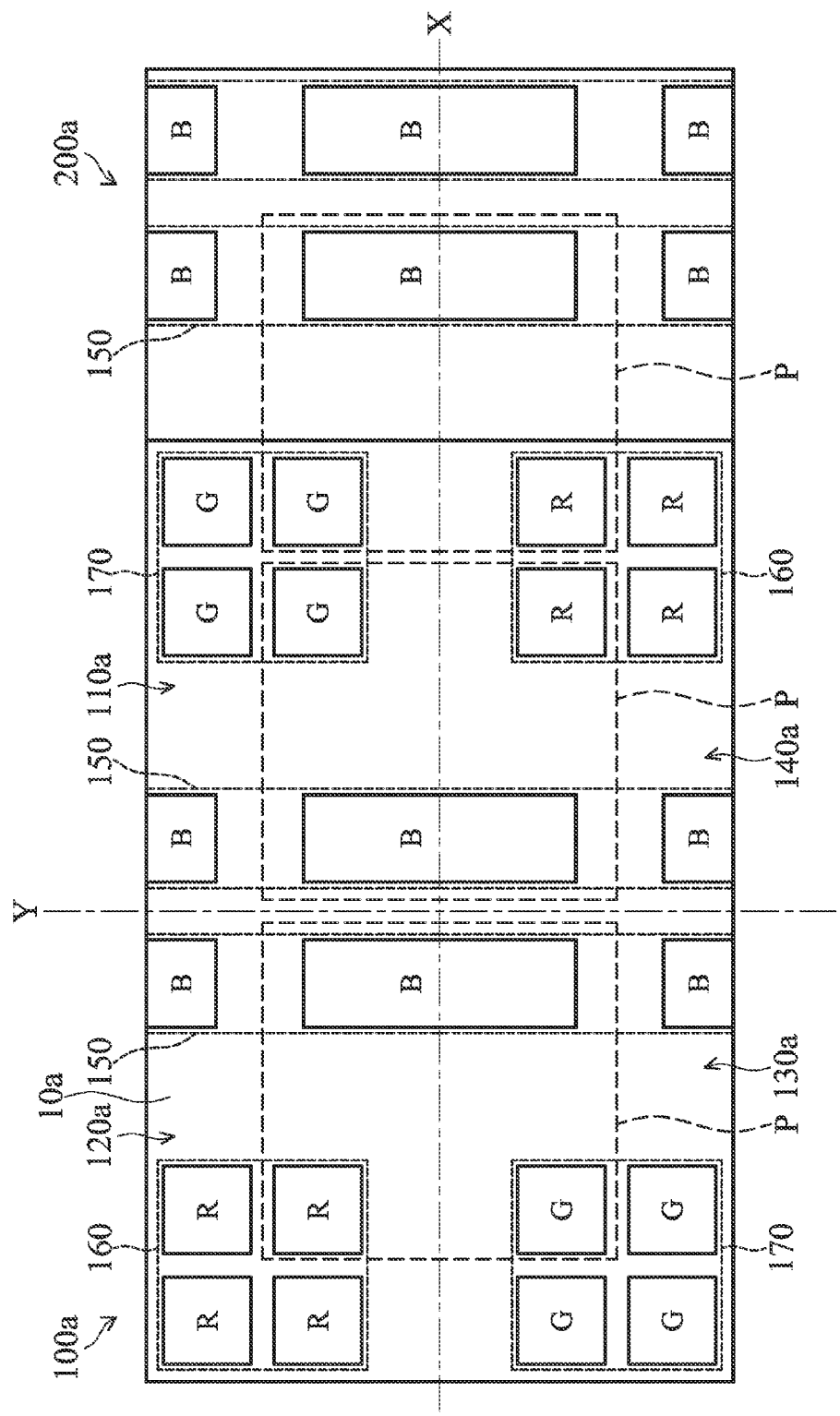
FIG. 4 shows a schematic view of a first and a second lighting element of the other embodiment of the present disclosure.

Referring to FIG. 4, a schematic view of a first and a second light-emitting unit 100a, 200a of an OLED display in accordance with another embodiment is shown in FIG. 4, in which elements similar with that of the first and second light-emitting units 100, 200 shown in FIG. 2 are provided with the same reference numbers, and the features thereof are not reiterated in the interest of brevity. The plurality of first and second light-emitting units 100a, 200a differ from the plurality of first and second light-emitting units 100, 200 in that the two second light-emissive layers 160 are disposed in the second and fourth regions 120a and 140a, and the two third light-emissive layers 170 are disposed in the first and third regions 110a and 130a. That is, the sub-pixels in the first region 110a and the sub-pixels in the third region 130a are point symmetric to a center of each of the plurality of first light-emitting units 100a and arranged such that the metal mask for vaporizing the organic material may have a better mechanical strength.

Figure 5:
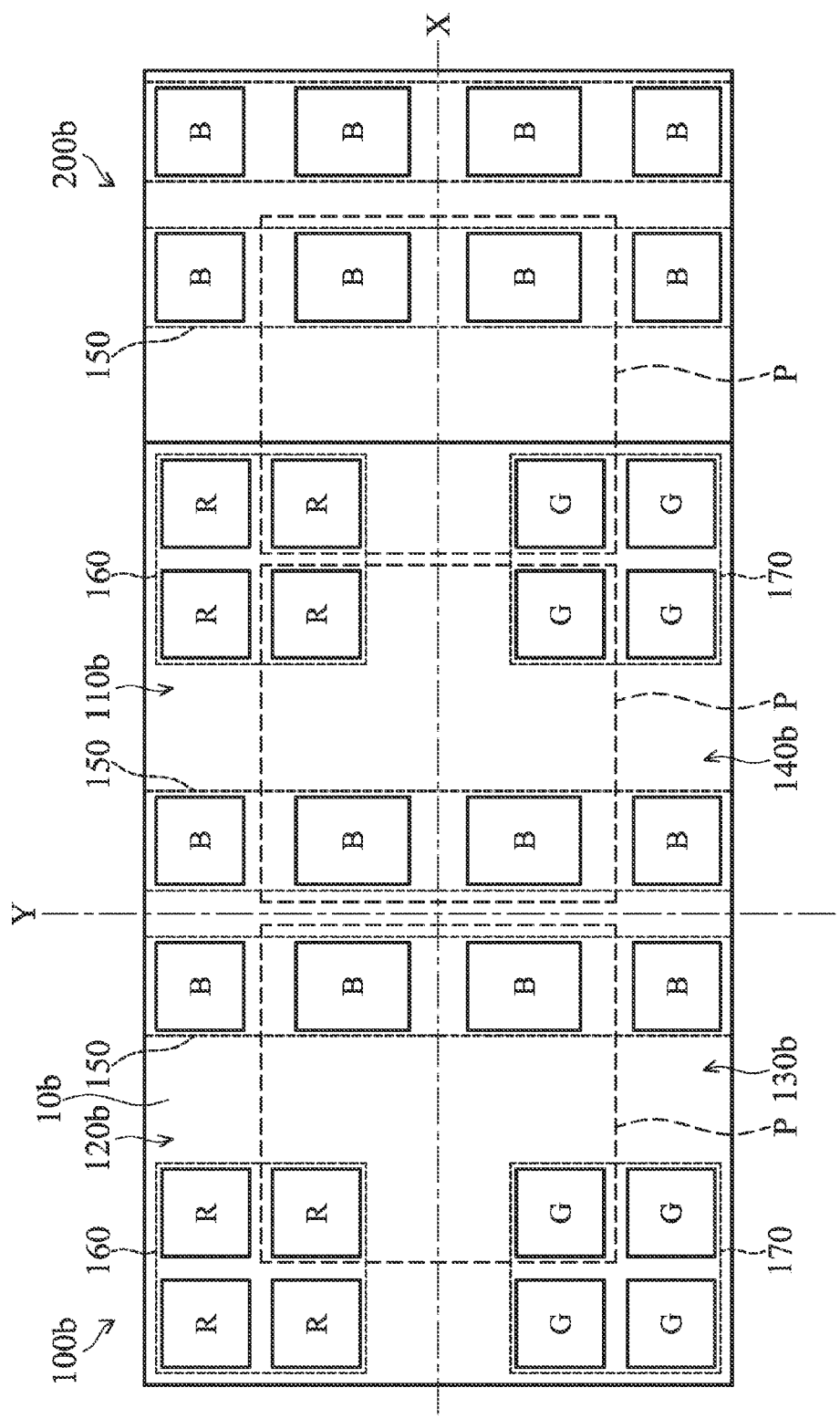
FIG. 5 shows a schematic view of a first and a second lighting element of the other embodiment of the present disclosure.

Referring to FIG. 5, a schematic view of a first and a second light-emitting unit 100b, 200b of an OLED display in accordance with another embodiment is shown in FIG. 5, in which elements similar with that of the plurality of first and second light-emitting units 100, 200 shown in FIG. 2 are provided with the same reference numbers, and the features thereof are not reiterated in the interest of brevity. The plurality of first and second light-emitting units 100b, 200b differ from the plurality of first and second light-emitting units 100, 200 in that each pixel unit P includes two first sub-pixels B, one second sub-pixel R and one sub-pixel G, thereby improving uniformity of illuminance of each pixel unit.

Figure 3B:
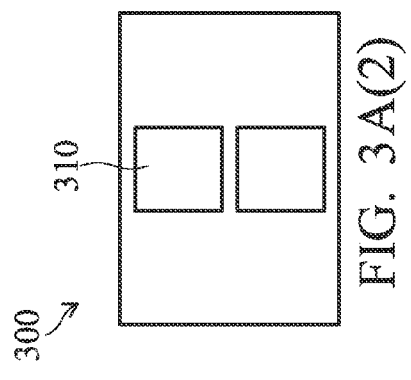
FIGS. 3A(1), 3A(2), 3B and 3C show masks of some embodiments of the present disclosure.
Figure 3B:
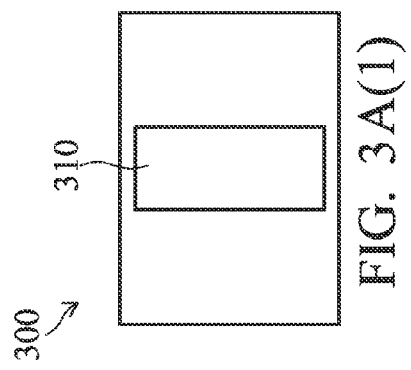
Figure 3B:
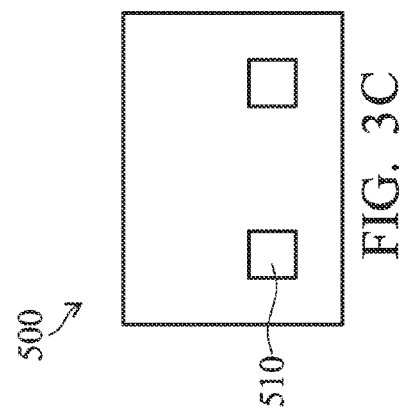
Figure 3C:
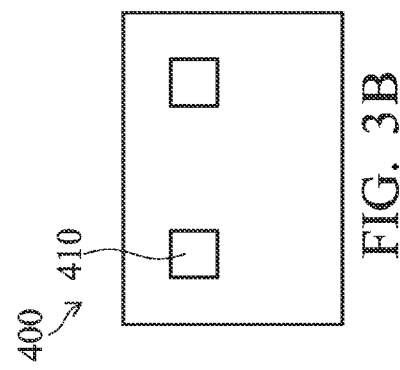
Figure 6:
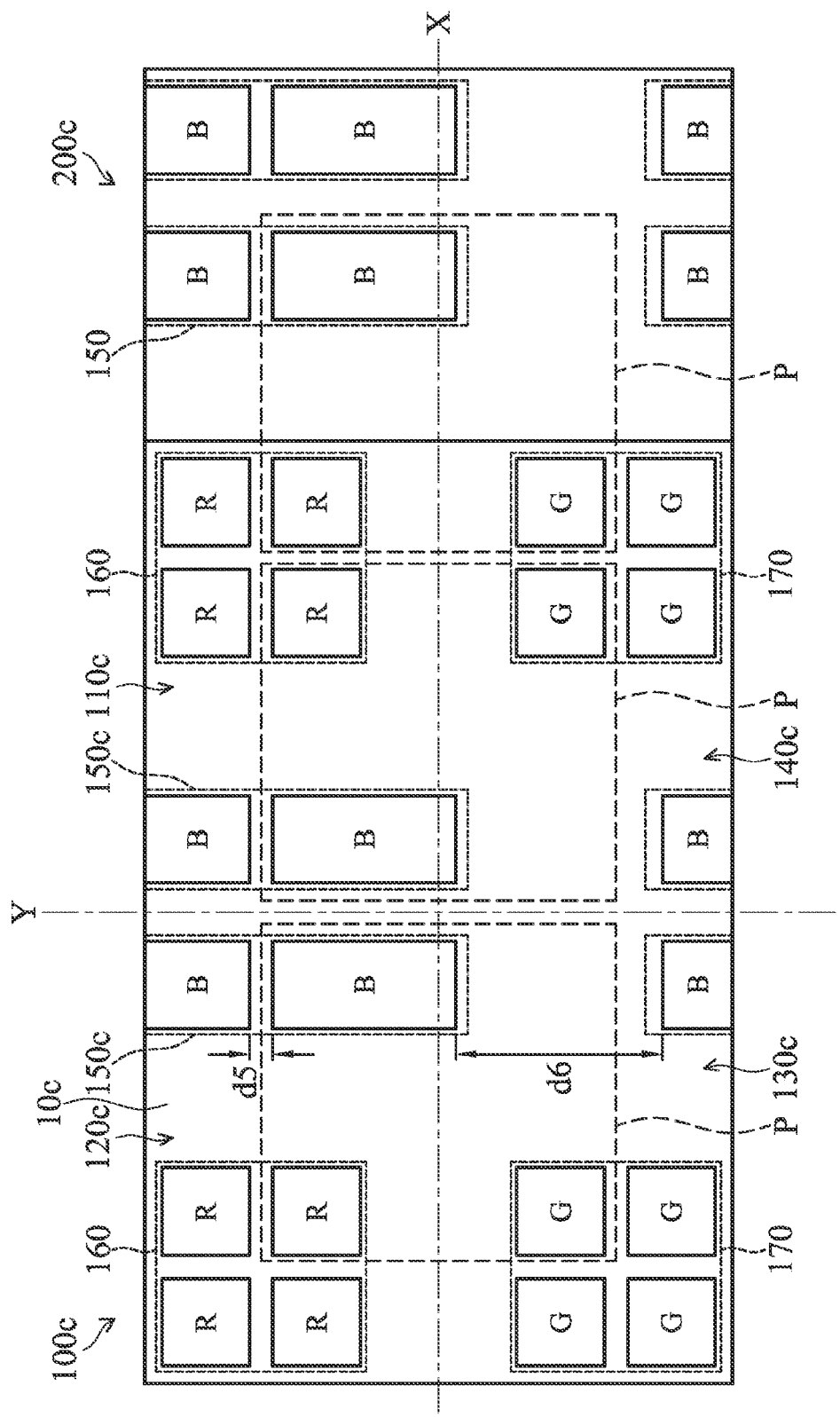
FIG. 6 shows a schematic view of a first and a second lighting element of the other embodiment of the present disclosure.

Referring to FIG. 6, a schematic view of a first and a second light-emitting unit 100c, 200c of an OLED display in accordance with another embodiment is shown in FIG. 6, in which elements similar with that of the plurality of first and second light-emitting units 100, 200 shown in FIG. 2 are provided with the same reference numbers, and the features thereof are not reiterated in the interest of brevity. The plurality of first and second light-emitting units 100c, 200c differ from the plurality of first and second light-emitting units 100, 200 in that in the direction parallel to the longitudinal axis Y the first sub-pixels 150c are spaced by a first distance d5 and a second distance d6 different from the first distance d5, periodically. While being manufactured, the first light-emissive layers 150c of the embodiment are evaporated by using a metal mask as shown in FIG. 3A(2).

By the arrangement of the sub-pixels, the OLED display manufactured by the same processing means as that of a conventional one may have a better display resolution, so as to improve the competitiveness of the OLED display.

While the invention has been described by way of example and in terms of the embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An OLED display, comprising:
a substrate;

a plurality of pixel units, wherein each of the pixel unit comprises a first sub-pixel, a second sub-pixel, and a third sub-pixel;

a plurality of first light-emitting units, arranged on the substrate in a matrix, wherein a transverse axis and a longitudinal axis intersecting to the transverse axis divide each of the plurality of first light-emitting units into a first region, a second region, a third region and a fourth region, wherein the first and third regions are located at opposite corners of each of the plurality of first light-emitting units, and each of the plurality of first light-emitting units comprises:

a first light-emissive layer, corresponding to the plurality of first sub-pixels and overlapping the longitudinal axis;

two second light-emissive layers, each corresponding to the plurality of second sub-pixels; and two third light-emissive layers, each corresponding to the plurality of third sub-pixels, wherein one of the second light-emissive layers and one of the third light-emissive layers are respectively disposed in one of the first and fourth regions, and the other second light-emissive layer and the other third light-emissive layer are respectively disposed in one of the second and third regions, and the two pixel units that are adjacent and arranged in a direction parallel to the longitudinal axis, wherein each of the same color sub-pixels in the two pixel units is symmetrical with each other with respect to the transverse axis.

2. The OLED display as claimed in claim 1, further comprising a plurality of second light-emitting units, wherein the plurality of first and second light-emitting units are arranged alternatively in a direction parallel to the transverse axis, and each second light-emitting unit comprises a first light-emissive layer adjacent to one of the plurality of first light-emitting units.

3. The OLED display as claimed in claim 1, wherein lights emitted from the first, second and third light-emissive layers have different wavelengths.

4. The OLED display as claimed in claim 3, wherein the maximum value among the light emitting wavelength of the first light-emissive layers range from 380 nm to 495 nm, the maximum value among the light emitting wavelength of the second light-emissive layers range from 580 nm to 700 nm, the maximum value among the light emitting wavelength of the third light-emissive layers range from 495 nm to 590 nm.

5. The OLED display as claimed in claim 3, wherein the light emitted from the first pixels of the first light-emissive layers in an excited state is blue light, the light emitted from the second pixels of the second light-emissive layers in an excited state is red light, and the light emitted from the third pixels of the third light-emissive layers in an excited state is green light.

6. The OLED display as claimed in claim 5, wherein each of the plurality of first light-emitting units comprises a plurality of pixels units, and each of the plurality of pixel units comprises at least one first sub-pixel, one second sub-pixel and one third sub-pixel.

7. The OLED display as claimed in claim 6, wherein in a single pixel unit, a total area of the first sub-pixels is larger than an area of the second sub-pixel, and the area of the first sub-pixel is larger than an area of the third sub-pixel.

8. The OLED display as claimed in claim 6, wherein a length of the first sub-pixels in the direction parallel to the longitudinal axis is larger than a length of the second sub-pixels or a length of the third sub-pixels in the direction parallel to the longitudinal axis.

9. The OLED display as claimed in claim 1, wherein each of the two second light-emissive layers corresponds to four second pixels, and each of the two third light-emissive layers corresponds to four third pixels.

10. The OLED display as claimed in claim 1, wherein a distance between one of the second light-emissive layers and the closest third light-emissive layer in the direction parallel to the longitudinal axis is larger than a distance between the second sub-pixels in each of the second light-emissive layer and is larger than a distance between the third sub-pixels in each of the third light-emissive layer.

11. The OLED display as claimed in claim 1, wherein a distance between one of the second light-emissive layers and the closest first light-emissive layer in a direction parallel to the transverse axis or a distance between one of the third light-emissive layers and the closest first light-emissive layer in the direction parallel to the transverse axis is larger than a distance between the second sub-pixels in each of the second light-emissive layer and is larger than a distance between the third sub-pixels in each of the third light-emissive layer and is larger than a distance between the first sub-pixels in each of the first light-emissive layer.

12. The OLED display as claimed in claim 1, wherein a distance between one of the second light-emissive layers and the closest first light-emissive layer in a direction parallel to the transverse axis or a distance between the third light-emissive layer and the closest first light-emissive layer in the direction parallel to the transverse axis is larger than a distance between the first sub-pixels in each of the first light-emissive layer.

13. The OLED display as claimed in claim 1, wherein in each of the plurality of first light-emitting units, one of the two second light-emissive layers is disposed in the first region, and the other second light-emissive layer is disposed in the second region.

14. The OLED display as claimed in claim 1, wherein in each of the plurality of first light-emitting units, one of the two second light-emissive layers is disposed in the first region, and the other second light-emissive layer is disposed in the third region.

15. The OLED display as claimed in claim 1, wherein in the direction parallel to the longitudinal axis, the first sub-pixels are spaced by the same distance.

16. The OLED display as claimed in claim 1, wherein in the direction parallel to the longitudinal axis, the first sub-pixels are spaced by a first distance and a second distance different from the first distance, periodically.

17. The OLED display as claimed in claim 1, wherein in each of the plurality of first light-emitting units, the sub-pixels in the first and fourth regions and the sub-pixels in the second and third regions are symmetrical with each other with respect to the longitudinal axis.

18. The OLED display as claimed in claim 1, wherein in each of the plurality of first light-emitting units, the sub-pixels in the first region and the sub-pixels in the third region are point symmetric to a center of each of the plurality of first light-emitting units.

19. The OLED display as claimed in claim 1, wherein the first, second and third sub-pixels are top-emitting OLEDs or bottom-emitting OLEDs.

20. An OLED display, comprising:
   a substrate; and
   a plurality of pixel units, wherein each of the plurality of pixel units comprises:
   a first sub-pixel;
   a second sub-pixel; and
   a third sub-pixel, wherein the configuration of the first, second and third sub-pixels in each of the two neighboring pixel units are symmetrical with each other.

21. The OLED display as claimed in claim 20, comprising:
- a first light-emissive layer, corresponding to a plurality of first sub-pixels;
- a second light-emissive layer, corresponding to four second sub-pixels, wherein the four second sub-pixels are simultaneously formed in the same evaporation process, and the second light-emissive layer among the four second sub-pixels is continuously extended; and
- a third light-emissive layer, corresponding to four third sub-pixels, wherein the four third sub-pixels are simultaneously formed in the same evaporation process, and the third light-emissive layer among the four third sub-pixels is continuously extended.

* * * * *